United States Patent
Merry et al.

(10) Patent No.: US 9,530,623 B2
(45) Date of Patent: Dec. 27, 2016

(54) PROCESS CHAMBER APPARATUS, SYSTEMS, AND METHODS FOR CONTROLLING A GAS FLOW PATTERN

(71) Applicant: Applied Materials, Inc., Santa Clara, CA (US)

(72) Inventors: Nir Merry, Mountain View, CA (US); Chandrakant M. Sapkale, Karnataka (IN); Izya Kremerman, Los Gatos, CA (US); Jeffrey C. Hudgens, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 577 days.

(21) Appl. No.: 14/091,111

(22) Filed: Nov. 26, 2013

(65) Prior Publication Data

US 2015/0145413 A1     May 28, 2015

(51) Int. Cl.
| | |
|---|---|
| F16K 51/00 | (2006.01) |
| H01J 37/32 | (2006.01) |
| F16K 51/02 | (2006.01) |
| F16K 31/00 | (2006.01) |
| F16K 1/24 | (2006.01) |

(52) U.S. Cl.
CPC ........... *H01J 37/32449* (2013.01); *F16K 1/24* (2013.01); *F16K 31/00* (2013.01); *F16K 51/00* (2013.01); *F16K 51/02* (2013.01); *Y10T 137/0318* (2015.04); *Y10T 137/8593* (2015.04)

(58) Field of Classification Search
CPC ............ F16K 51/00; F16K 1/24; F16K 51/02; F16K 31/00; F16K 31/44; F16K 31/58; C23C 16/4412; Y10T 137/0318; Y10T 137/8593

USPC ... 251/86, 298, 129.2, 228, 229, 340; 137/1, 137/561 R; 239/581.2
See application file for complete search history.

(56) References Cited

U.S. PATENT DOCUMENTS

| | | | | | |
|---|---|---|---|---|---|
| 4,251,053 | A | * | 2/1981 | Wurzer | F16K 7/16 137/855 |
| 4,354,640 | A | * | 10/1982 | Hans | F02M 51/065 239/533.9 |
| 5,452,878 | A | * | 9/1995 | Gravesen | F15C 5/00 251/129.01 |
| 5,501,427 | A | * | 3/1996 | Ando | F16K 1/2007 251/228 |
| 5,667,197 | A | * | 9/1997 | Boyd | F16K 3/18 137/559 |
| 5,954,079 | A | | 9/1999 | Barth et al. | |

(Continued)

OTHER PUBLICATIONS

International Search Report and Written Opinion of International Application No. PCT/US2014/066974 mailed Mar. 17, 2015.

(Continued)

*Primary Examiner* — John Bastianelli
(74) *Attorney, Agent, or Firm* — Dugan & Dugan, PC

(57) ABSTRACT

Process chamber gas flow control apparatus may include, or be included in, a process chamber configured to process a substrate therein. The gas flow control apparatus may include a valve configured to seal an exhaust port in the process chamber. The valve may be moveable in the X, Y, and Z directions relative to the exhaust port to adjust a gas flow pattern (including, e.g., flow rate and/or flow uniformity) within the process chamber. Methods of adjusting a flow of a process gas within a process chamber are also provided, as are other aspects.

20 Claims, 9 Drawing Sheets

(56) References Cited

U.S. PATENT DOCUMENTS

| | | | |
|---|---|---|---|
| 6,079,693 A * | 6/2000 | Ettinger | F16K 3/188 |
| | | | 251/175 |
| 6,093,252 A | 7/2000 | Wengert et al. | |
| 6,190,732 B1 | 2/2001 | Omstead et al. | |
| 6,192,827 B1 * | 2/2001 | Welch | H01J 37/32458 |
| | | | 118/723 E |
| 6,592,709 B1 | 7/2003 | Lubomirsky | |
| 6,708,945 B2 | 3/2004 | Horiuchi et al. | |
| 7,497,414 B2 * | 3/2009 | Lee | F16K 1/24 |
| | | | 251/177 |
| 7,845,618 B2 * | 12/2010 | Kim | F16K 1/24 |
| | | | 251/177 |
| 2006/0266962 A1 * | 11/2006 | Kanzaka | F16K 51/02 |
| | | | 251/63.6 |
| 2009/0272324 A1 | 11/2009 | Balasubramanyam et al. | |
| 2009/0320948 A1 * | 12/2009 | Asanuma | F16K 1/16 |
| | | | 137/627.5 |
| 2009/0325386 A1 | 12/2009 | Devine et al. | |
| 2010/0099266 A1 | 4/2010 | Oswald et al. | |
| 2011/0095220 A1 * | 4/2011 | Geiser | F16K 51/02 |
| | | | 251/298 |
| 2011/0140023 A1 * | 6/2011 | Sauer | F16K 49/007 |
| | | | 251/298 |
| 2011/0186762 A1 * | 8/2011 | Geiser | F16K 51/02 |
| | | | 251/303 |
| 2011/0265887 A1 * | 11/2011 | Lee | H01L 21/67017 |
| | | | 137/334 |
| 2012/0034136 A1 | 2/2012 | Collins et al. | |
| 2012/0045903 A1 | 2/2012 | Harada et al. | |

OTHER PUBLICATIONS

International Preliminary Report on Patentability of International Application No. PCT/US2014/066974 mailed Jun. 9, 2016.

Merry et al., U.S. Appl. No. 14/091,130 (17342), titled: Process Chamber Gas Flow Apparatus, Systems, and Methods, filed Nov. 26, 2013.

* cited by examiner

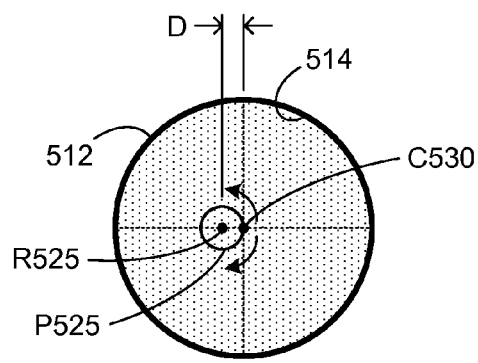
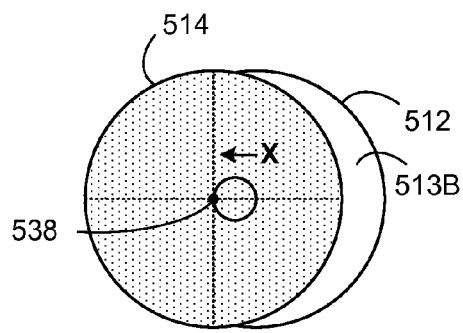
*FIG. 5A*    *FIG. 5B*
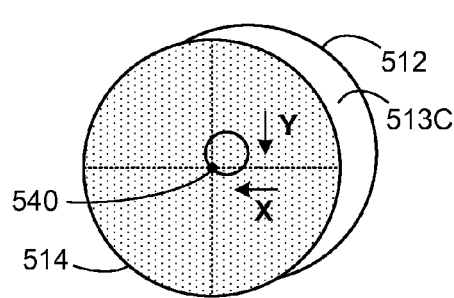
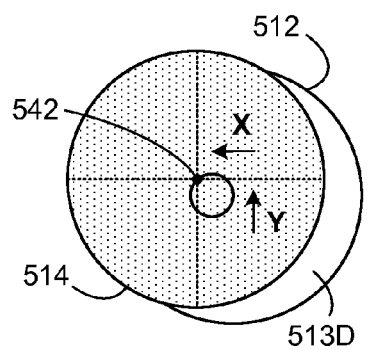
*FIG. 5C*    *FIG. 5D*
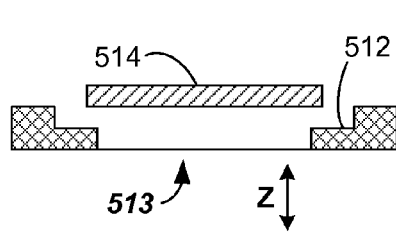
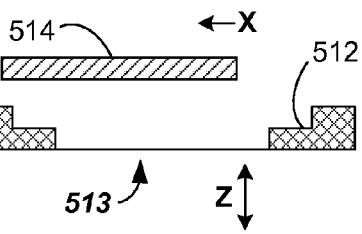
*FIG. 5E*    *FIG. 5F*

PROCESS CHAMBER APPARATUS, SYSTEMS, AND METHODS FOR CONTROLLING A GAS FLOW PATTERN

FIELD

The invention relates generally to electronic device manufacturing, and more particularly to valve apparatus, systems, and methods for controlling a flow of process gas in a process chamber.

BACKGROUND

Conventional electronic device manufacturing systems may include one or more process chambers configured to perform any number of substrate processes including, e.g., degassing, pre-cleaning or cleaning, deposition (e.g., chemical vapor deposition (CVD), physical vapor deposition (PVD), and/or atomic layer deposition), coating, oxidation, nitration, etching (e.g., plasma etching), and the like. Substrates may be semiconductor wafers, glass plates or panels, and/or other workpieces used to make electronic devices or circuit components. Substrates may be transferred into and out of a process chamber via a slit valve. Once a substrate is properly positioned within a process chamber, the slit valve may be closed, and the processing of the substrate may begin. As part of the processing, certain process gases may be introduced into the process chamber. Under some conditions, the flow of gas in the process chamber may not be uniform, which can lead to undesirable non-uniform processing (e.g., non-uniform etching, deposition, and/or the like). Various methods of controlling gas flow in a process chamber are known, such as using multiple inflow conduits and valves. However, such gas flow control systems tend to be complicated and expensive, and still may not adequately address non-uniform gas flow.

Accordingly, improved apparatus, systems, and methods for adjusting a gas flow pattern (e.g., gas flow rate and uniformity) in a process chamber are desired.

SUMMARY

According to a first aspect, a process chamber gas flow control apparatus is provided. The process chamber gas flow control apparatus comprises a process chamber configured to process a substrate therein, the process chamber having an exhaust port; and a valve configured to seal the exhaust port and configured to move in the X, Y, and Z directions relative to the exhaust port to adjust a gas flow pattern within the process chamber.

According to a second aspect, an electronic device manufacturing system is provided. The electronic device manufacturing system comprises a process chamber configured to process a substrate therein, the process chamber having an exhaust port; a process gas inlet coupled to the process chamber and configured to direct a process gas into the process chamber; and a valve configured to seal the exhaust port and configured to move in the X, Y, and Z directions relative to the exhaust port to adjust a gas flow pattern within the process chamber.

According to a third aspect, a method of adjusting a flow of a process gas within a process chamber is provided. The method comprises providing a process chamber having an exhaust port; providing a valve configured to seal the exhaust port and configured to move in the X, Y, and Z directions relative to the exhaust port; and adjusting a gas flow pattern in the process chamber by moving the valve in one or more of the X, Y, and Z directions.

Still other aspects, features, and advantages of embodiments of the invention may be readily apparent from the following detailed description wherein a number of example embodiments and implementations are described and illustrated, including the best mode contemplated for carrying out the invention. The invention may also include other and different embodiments, and its several details may be modified in various respects, all without departing from the scope of the invention. Accordingly, the drawings and descriptions are to be regarded as illustrative in nature, and not as restrictive. The invention covers all modifications, equivalents, and alternatives falling within the scope of the invention.

BRIEF DESCRIPTION OF DRAWINGS

The drawings, described below, are for illustrative purposes only and are not necessarily drawn to scale. The drawings are not intended to limit the scope of this disclosure in any way.

FIGS. 5A-5D illustrate simplified top views of example movements of an exhaust port valve in the X and/or Y directions according to embodiments.

FIGS. 5E-5F illustrate simplified cross-sectional side views of example movements of an exhaust port valve in the Z and X directions according to embodiments.

DETAILED DESCRIPTION

Figure 1:
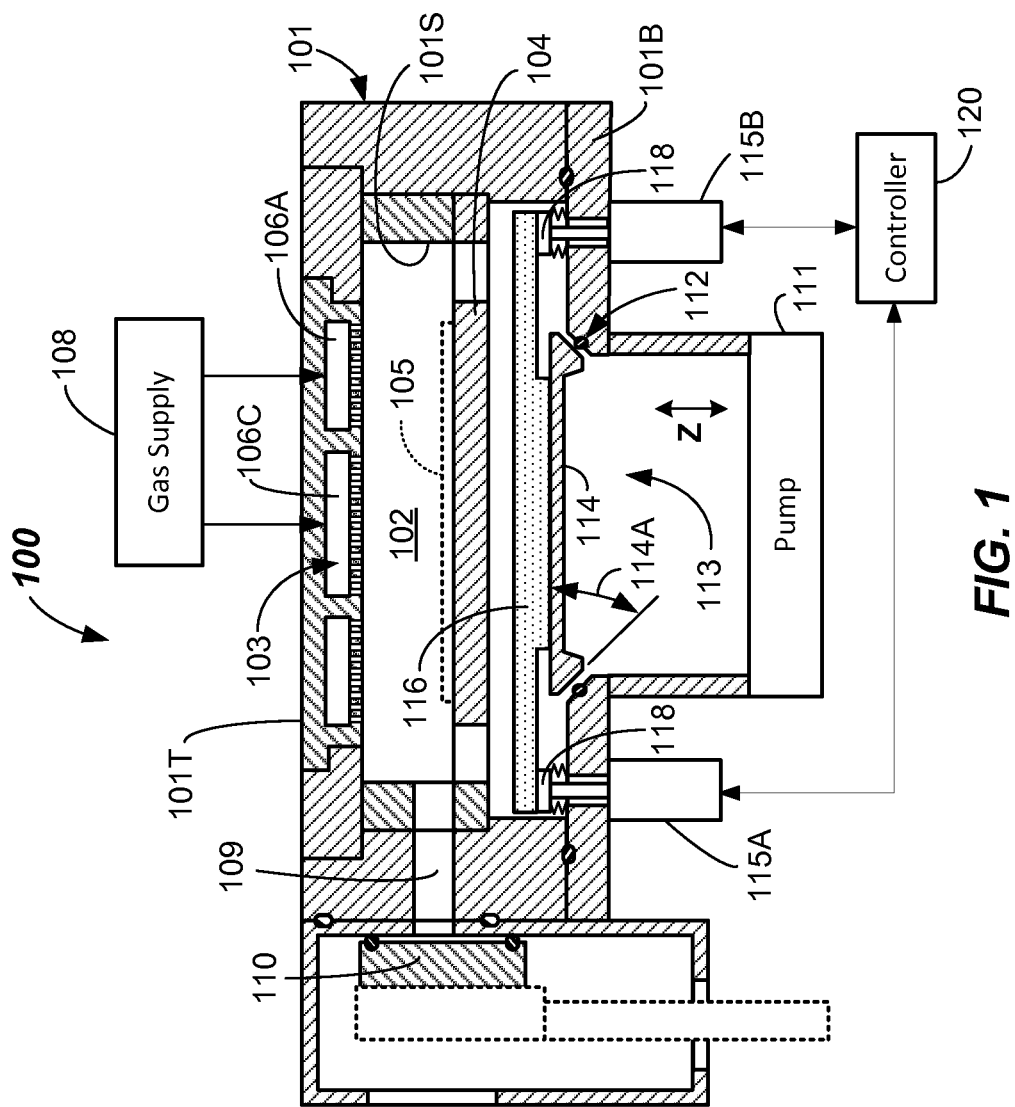
FIG. 1 illustrates a cross-sectional side view of an electronic device manufacturing system that includes process chamber gas flow control apparatus having a valve configured to move in the X, Y, and Z directions according to embodiments.

Reference will now be made in detail to the example embodiments of this disclosure, which are illustrated in the accompanying drawings. Wherever possible, the same reference numbers will be used throughout the drawings to refer to the same or like parts.

Electronic device manufacturing systems may use pressure control within a process chamber to control a rate of processing or other processing parameters. Known process chamber gas flow control apparatus typically includes a process gas inlet via which a process gas may be supplied to the chamber. The process gas inlet may be located at a top of the process chamber A gas exhaust port is usually located on a side of the process chamber opposite the process gas inlet, such as, e.g., at a bottom of the process chamber. A suitable pump, such as a turbo pump, may be located adjacent or below the exhaust port. Known process chamber gas flow control apparatus typically includes an exhaust port valve that can seal and open the exhaust port by moving linearly toward and away from the port (e.g., up and down for bottom exhaust ports, which is the Z direction as defined herein). Positional adjustments of the exhaust port valve in the Z-direction can be used to modulate chamber pressure and/or control the overall gas flow rate. Such process chamber gas flow control apparatus, however, may experience undesirable non-uniform gas flow patterns within the process chamber. These non-uniform gas flow patterns may cause uneven processing or other problems such as uneven deposition, uneven etching, and the like.

Process chamber gas flow control apparatus in accordance with one or more embodiments may be provided to improve control of gas flow patterns within a process chamber. Such process chamber gas flow control apparatus may include an exhaust port valve configured to seal an exhaust port of the process chamber and to move in the X, Y, and Z directions relative to the exhaust port. Movements of the exhaust port valve in the X, Y, and Z directions may create openings of various size and location between the valve and the exhaust port that can be used to adjust a gas flow pattern within the process chamber. That is, by varying the size and location of an exhaust port opening via selected movements of the valve in one or more of the X, Y, and Z directions, the gas flow pattern within the process chamber can be shifted and/or adjusted as desired. The X and Y directions are defined as being in planes parallel to the exhaust port, while the Z direction is defined as being perpendicular to the exhaust port, as will be illustrated in the FIGs. and explained in more detail below.

In one aspect, apparatus for process chamber gas flow control may include a plurality of actuators, a support arm assembly coupled to the plurality of actuators, and a slide member coupled to one of the plurality of actuators and to an exhaust port valve and configured to adjust an offset between a center of the exhaust port and an axis of rotation. This configuration may allow the exhaust port valve to move in the X, Y, and/or Z directions relative to an exhaust port of a process chamber.

In another aspect, apparatus for process chamber gas flow control may include a plurality of linear actuators configured to move an exhaust port valve in the Z direction, at least one rotational actuator configured to move the exhaust port valve in the X and Y directions, and a plurality of rotatable-joint arms each coupled to the exhaust port valve and to a respective one of the plurality of linear actuators. One of the plurality rotatable-joint arms may be coupled to the rotational actuator. This configuration may allow the valve to move in the X, Y, and/or Z directions relative an exhaust port of a process chamber.

In a further aspect, apparatus for process chamber gas flow control may include an arm having a first end rotatably coupled to an exhaust port valve at a location offset from the center of the valve, and a second end rotatably coupled to an actuator. The arm may be configured to move linearly in the Z direction via a coupling at the second end and, together with rotational movements at the first and second ends, may be configured to move the valve in the X, Y, and/or Z directions relative an exhaust port of a process chamber.

Further details of example embodiments illustrating and describing the various aspects above, as well as other aspects including methods of adjusting a flow of a process gas within a process chamber, will be explained in greater detail below in connection with FIGS. 1-6.

FIG. 1 illustrates an electronic device manufacturing system 100 in accordance with one or more embodiments. Electronic device manufacturing system 100 may be configured to process a single substrate or two or more substrates concurrently. A substrate may be a semiconductor wafer, glass plate or panel, and/or other workpiece used to make electronic devices and/or circuit components. One or more substrate processes such as degassing, cleaning or pre-cleaning, deposition (such as chemical vapor deposition (CVD), physical vapor deposition (PVD), or atomic layer deposition), coating, oxidation, nitration, etching (e.g., plasma etching), or the like may be performed in electronic device manufacturing system 100. Other processes may alternatively or additionally be performed in some embodiments.

Electronic device manufacturing system 100 may include a housing 101 that may include a top 101T, side walls 1015, and a bottom 101B. Top 101T, bottom 101B, and side walls 1015 may at least partially define a process chamber 102 within housing 101. Top 101T may include a process gas inlet 103, and bottom 101B may include a gas exhaust port 113. Process chamber 102 may be configured to receive a substrate 105 (shown dotted), which may rest upon or otherwise be supported relative to a support structure, such as a pedestal 104. Other types of substrate support structures may be used, such as lift pins. Conventionally, substrate 105 may be received in and withdrawn from process chamber 102 through a side opening 109 via a slit valve 110 or other like sealing member that opens and closes. In some embodiments, process chamber 102 may be operated at a vacuum pressure. A vacuum may be provided in process chamber 102 by operation of one or more pumps 111 (e.g., one or more turbo pumps) connected to gas exhaust port 113.

Process gas inlet 103 may be located in an upper portion of process chamber 102 and may have one or more inlet passages configured to direct one or more process gases into process chamber 102. In some embodiments, process gas inlet 103 may include a center region 106C and an outer annular region 106A surrounding center region 106C. Gas received from a gas supply 108 may be provided to regions 106A and 106C. Gas flow rates may be adjusted between center and outer annular regions 106C and 106A to at least partially equalize flow distribution within process chamber 102. Other types of gas inlets may be used, including, e.g., side gas inlets.

Gas exhaust port 113 may include a valve seat 112 that may be configured to receive an exhaust port valve 114. Exhaust port valve 114 may be configured to seal gas exhaust port 113. That is, movement of exhaust port valve 114 may open and close exhaust port 113, including a complete gas-tight sealing of exhaust port 113. Exhaust port valve 114 may be a single-piece disc-shaped structure that may be constructed of any suitable high temperature rigid material, such as, e.g., stainless steel. Other suitable materials may be used.

In some embodiments, exhaust port valve 114 and valve seat 112 may have sealing surfaces that are relatively conical, as shown in FIG. 1. A cone angle 114A on valve 114 may be between about 0 and 90 degrees or, in some embodiments, between about 5 and 45 degrees. A cone angle on valve seat 112 may be about the same or, in some embodiments, slightly different than cone angle 114A. An elastomeric seal may be provided on one or both of the sealing surfaces. As shown in FIG. 1, a seal may be provided on housing bottom 101B. The seal may be a high temperature elastomer material, such as, e.g., a perfluoroelastomer such as CHEMRAZ® available from Greene, Tweed & Company. Other materials may be used.

Exhaust port valve 114 may be configured to move in one or more X, Y, and Z directions relative to gas exhaust port 113 and valve seat 112. Various movements of exhaust port valve 114 in the X, Y, and/or Z directions may provide various opening sizes between valve 114 and valve seat 112 at various locations about a periphery of valve 114 relative to valve seat 112. By varying the amount and radial location of such openings, a gas flow pattern within process chamber 102 may be adjusted. For example, moving valve 114 such that a relatively larger gap exists between valve 114 and valve seat 112 on one side of exhaust port 113, while a relatively smaller gap exists between valve 114 and valve seat 112 on another side of exhaust port 113, may result in increased gas flow through the larger gap. This may cause relatively higher process gas flow about pedestal 104 in the radial region nearest the larger gap. Such movements of valve 114 relative to valve seat 112 may be used to make various adjustments to a gas flow pattern within process chamber 102.

A gas flow pattern may be determined to need an adjustment by examining one or more processed substrates 105 for non-uniform processing. Upon identifying non-uniform processing, appropriate movements of valve 114 can be selected to create a suitably sized and positioned opening between valve 114 and valve seat 112 such that the non-uniformity may be corrected or at least reduced. In some embodiments, process chamber 102 may include one or more pressure or flow sensors configured to provide data regarding gas flow patterns within process chamber 102. Such data may then be used to make adjustments as needed to the position of valve 114 relative to valve seat 112.

In some embodiments, overall process gas flow rate (which may be referred to as "conductance") within process chamber 102 may be controlled by raising or lowering the height (or increasing or decreasing a distance) of valve 114 relative to valve seat 112 (i.e., the Z-direction as used herein). For example, a gap between valve 114 and valve seat 112 may be increased to increase a process gas flow rate or decreased to decrease a process gas flow rate in process chamber 102.

The movement of exhaust port valve 114 relative to gas exhaust port 113 and valve seat 112 may be accomplished by any suitable means, such as by action of a plurality of actuators (e.g., actuators 115A and 115B). The plurality of actuators may include at least one rotational actuator (e.g., a motor) configured to move valve 114 in the X and/or Y directions, and at least one linear actuator configured to move valve 114 in the Z direction. In some embodiments, a plurality of actuators may be arranged about valve 114 in equally-spaced increments, such as, e.g., at 120-degree increments in those embodiments having three actuators.

As shown in FIG. 1, exhaust port valve 114 may be coupled to a valve support mechanism 116, and the plurality of actuators (e.g., actuators 115A and 115B) may be coupled to valve support mechanism 116. Valve support mechanism 116 may include couplings 118, which may be any suitable mechanical member configured to attach to and/or facilitate transfer of linear and/or rotational motion from an actuator to exhaust port valve 114. Sealing between housing bottom 101B and couplings 118 may, in some embodiments, be provided by suitable flexible metal bellows or other suitable sealing members. Various embodiments of valve support mechanism 116 are described below in connection with FIGS. 2A-4D. Alternatively or additionally, other suitable types of valve support mechanisms and/or numbers and/or types of actuators than those shown and described herein may be used.

A controller 120 may interface with and be operative to control the plurality of actuators (e.g., actuators 115A and 115B), thereby causing valve support mechanism 116 to move exhaust port valve 114 in any one or more of the X, Y, and/or Z directions relative to exhaust port 113 and valve seat 112. In this manner, control of process gas flow conductance and/or process gas flow uniformity in process chamber 102 may be provided. In some embodiments, controller 120 may also control some or all of the processing and transferring of substrates in and through electronic device manufacturing system 100. Controller 120 may be, e.g., a general purpose computer and/or may include a microprocessor or other suitable CPU (central processing unit), a memory for storing software routines that may control the plurality of actuators and other aspects of electronic device manufacturing system 100, input/output peripherals, and support circuits (such as, e.g., power supplies, clock circuits, circuits for driving robots, a cache, and/or the like).

Figure 2A:
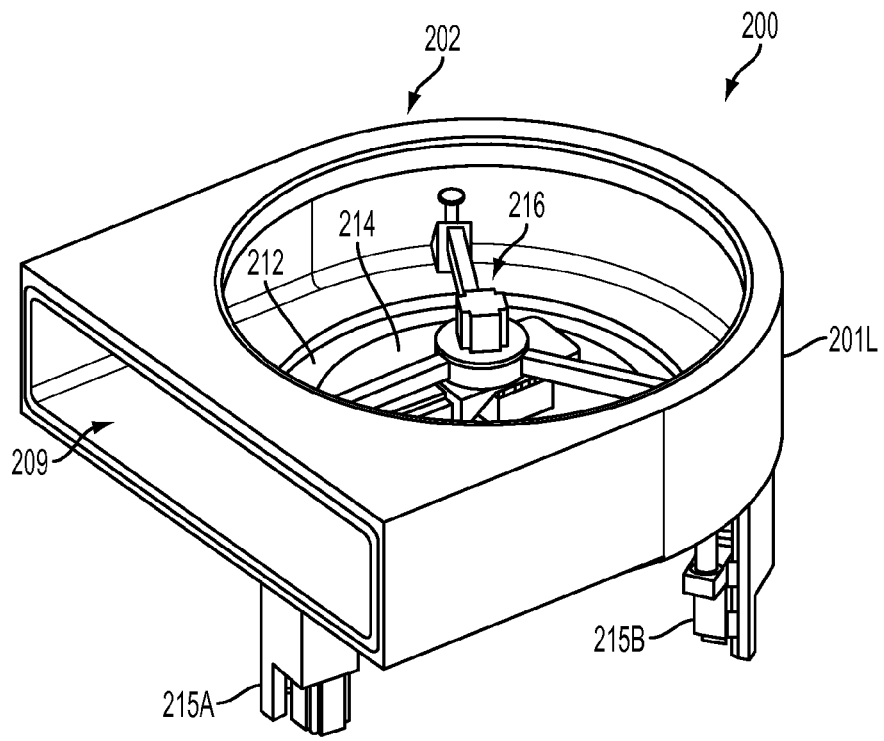
FIGS. 2A-2B illustrate simplified perspective views of a first process chamber gas flow control apparatus according to embodiments.
Figure 2B:
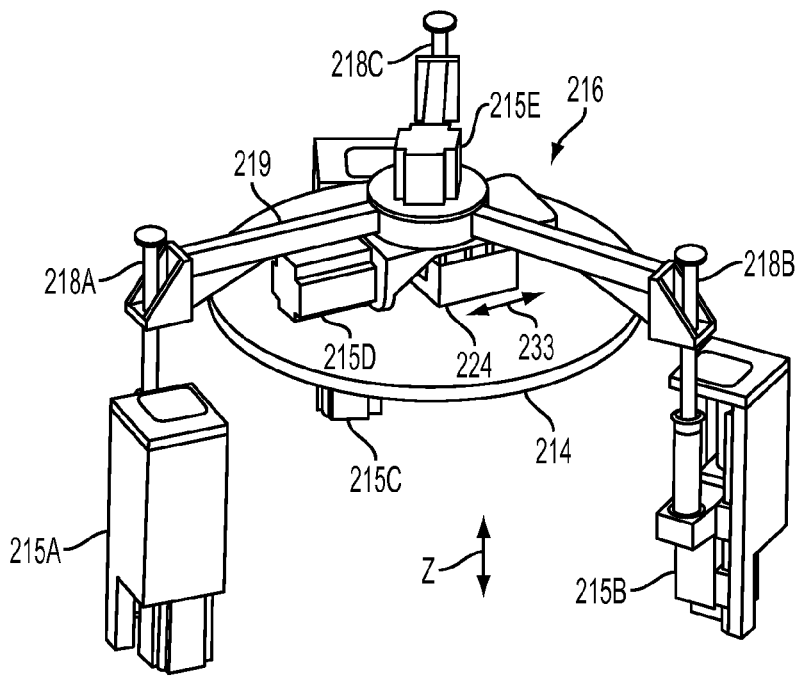
Figure 2C:
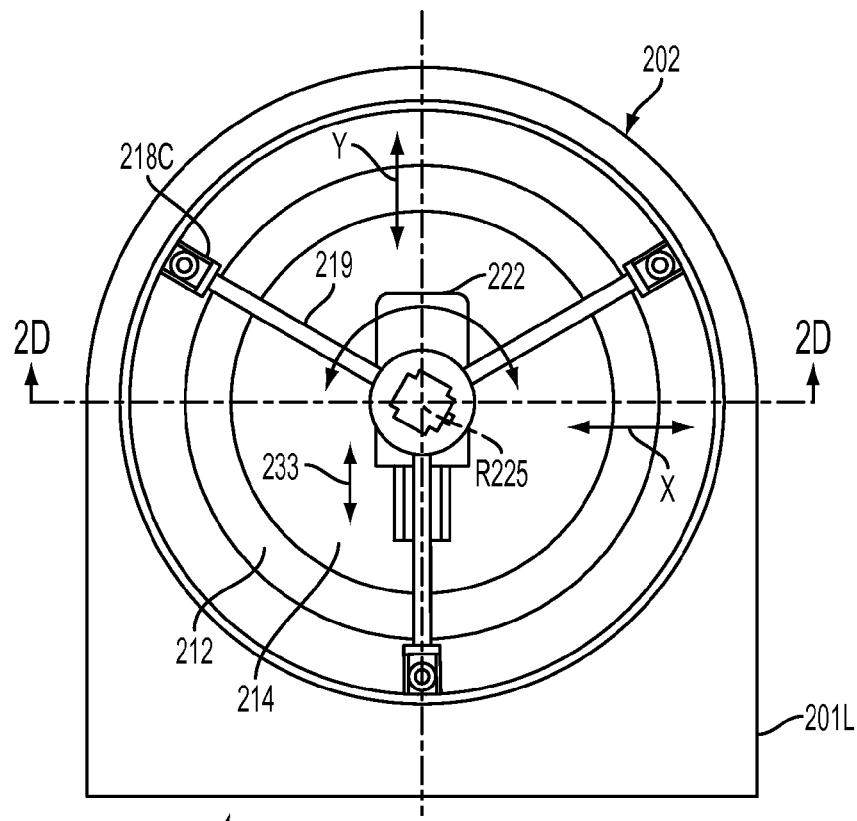
FIGS. 2C-2E illustrate simplified top, cross-sectional side, and exploded perspective views of the first process chamber gas flow control apparatus according to embodiments.
Figure 2D:
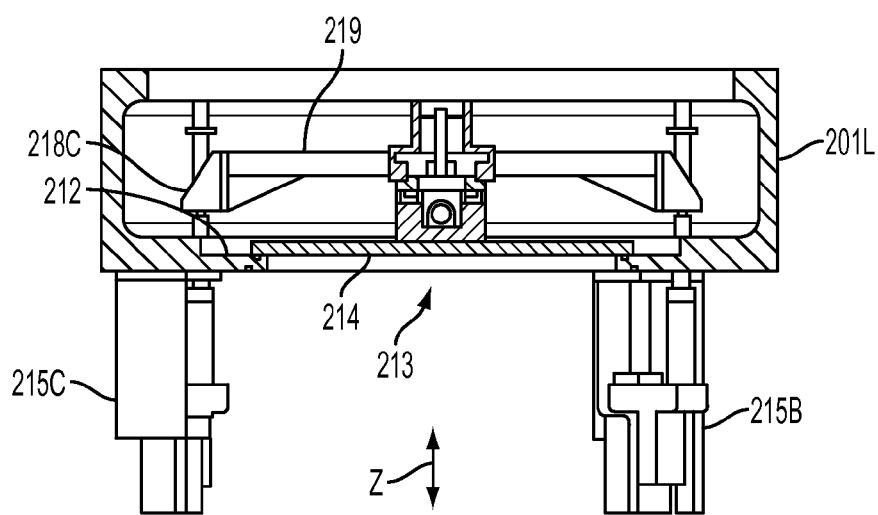
Figure 2E:
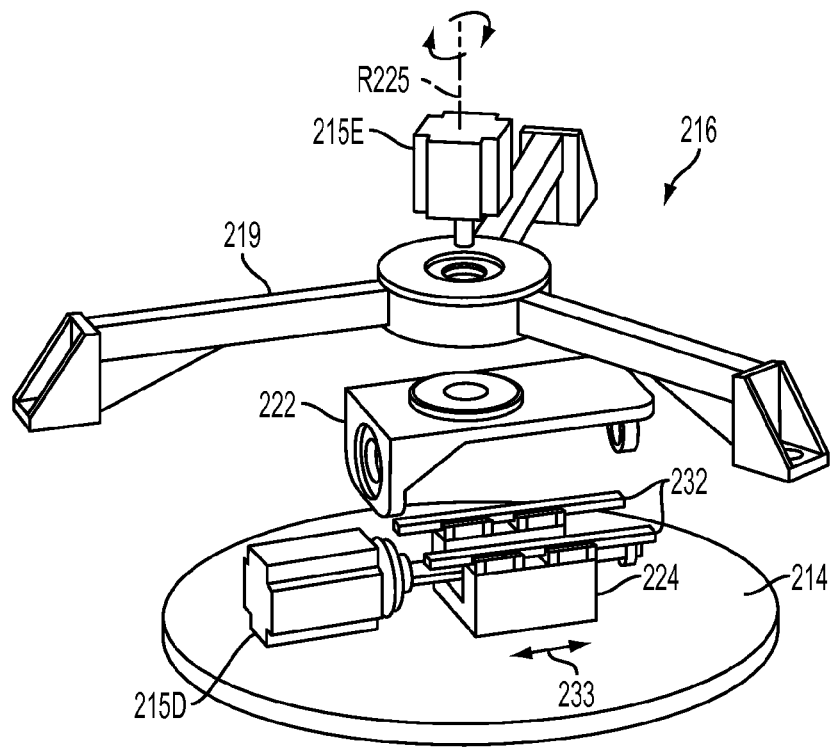

FIGS. 2A-D show a first example embodiment of a process chamber gas flow control apparatus 200. Apparatus 200 may include a process chamber 202 (of which only a lower housing portion 201L is shown in FIGS. 2A, 2C, and 2D). Process chamber 202 may include a side opening 209 configured to receive a slit valve or other suitable sealing member. Process chamber 202 may also include a valve seat 212 and a gas exhaust port 213 (FIG. 2D). Valve seat 212 may be configured to receive an exhaust port valve for completely sealing gas exhaust port 213.

Apparatus 200 may also include an exhaust port valve 214, a plurality of actuators 215A-E, and a valve support mechanism 216. Exhaust port valve 214 may be configured to seal exhaust port 213 and configured to move in the X, Y, and Z directions relative to exhaust port 213 to adjust a gas flow pattern within process chamber 202. The plurality of actuators 215A-E may be configured to move exhaust port valve 214 in X, Y, and Z directions. Valve support mechanism 216 may include a plurality of couplings 218A-C, a support arm assembly 219, a support bracket 222, and a slide member 224. Support arm assembly 219 may be coupled to actuators 215A-C via respective couplings 218A-C. Actuators 215A-C may be linear actuators configured to move exhaust port valve 214 in the Z direction. Actuator 215D may be a linear actuator coupled to support bracket 222 and to slide member 224. Slide member 224 may be coupled to support bracket 222 via a pair of linear guides 232 and to exhaust port valve 214 at a location offset from a center of exhaust port valve 214. Linear actuator 215D may be configured to move exhaust port valve 214 linearly in an X-Y plane as indicated by arrow 233 or, e.g., in the Y direction as oriented in FIG. 2C. More particularly, linear actuator 215D may be configured to move slide member 224, which is attached to valve 214, along linear guides 232. This movement of slide member 224 may be used to adjust an offset between a center of exhaust port 213 and a rotational axis R225. Actuator 215E may be a rotational actuator configured to rotate exhaust port valve 214 about axis R225. Actuator 215E may be coupled to arm support assembly 219 and support bracket 222 via a rotatable ball screw (not shown).

To adjust a gas flow pattern in process chamber 202, linear actuators 214A-C may move exhaust port valve 214 in the Z direction by a desired amount away from exhaust port 213 to create an equal opening in the Z direction radially between exhaust port valve 314 and valve seat 312. Optionally, actuator 215D may linearly adjust the position of valve 214 in the X-Y plane by a desired amount to adjust the size of an opening in X-Y plane between valve 214 and valve seat 212. Actuator 215E may then rotate valve 214 about axis R225 to adjust the radial location of the opening in the X-Y plane between valve 214 and valve seat 212. (See FIGS. 5A-5D for examples of valve movements and openings in the X and/or Y directions.) The created opening may result in a desired adjustment of the gas flow pattern in process chamber 202. A controller, such as, e.g., controller 120, may be coupled to and configured to drive the plurality of actuators 215A-E to move exhaust port valve 214 in desired X, Y, and/or Z directions.

In alternative embodiments, valve support mechanism 216 may be positioned and coupled to exhaust port valve 214 below and/or outside of process chamber 202. In such embodiments, valve support mechanism 216 may also be below and/or outside of process chamber 202.

Figure 3A:
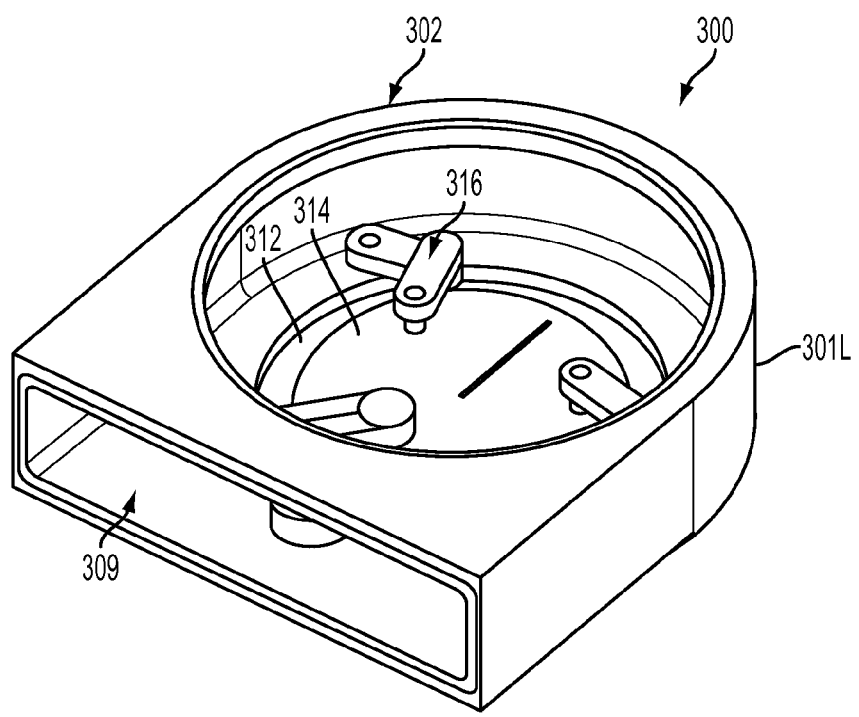
FIGS. 3A-3C illustrate simplified perspective, top, and cross-sectional side views of a second process chamber gas flow control apparatus according to embodiments.
Figure 3B:
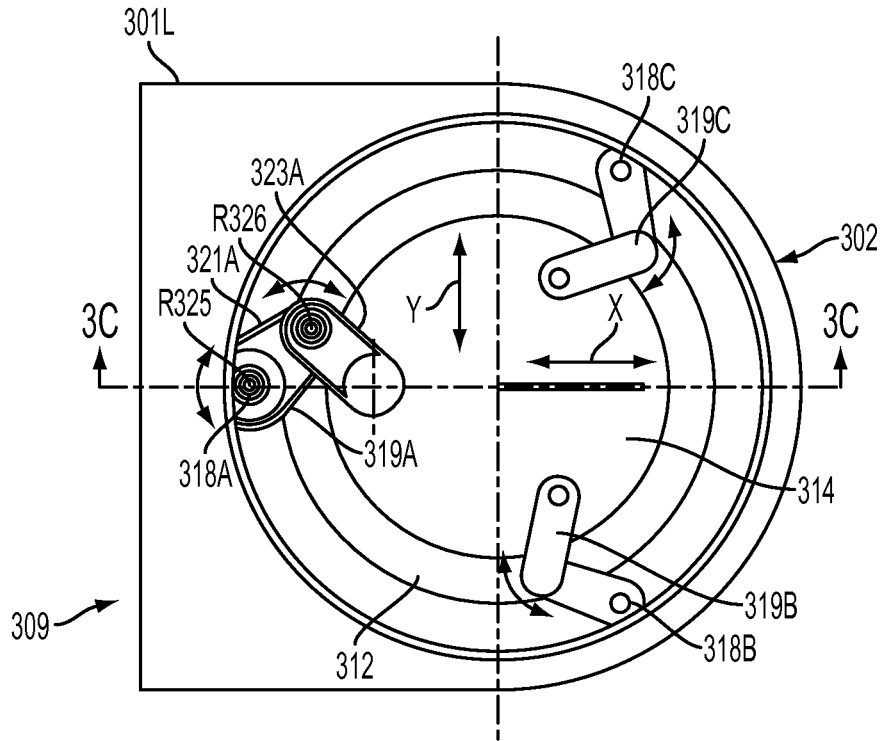
Figure 3C:
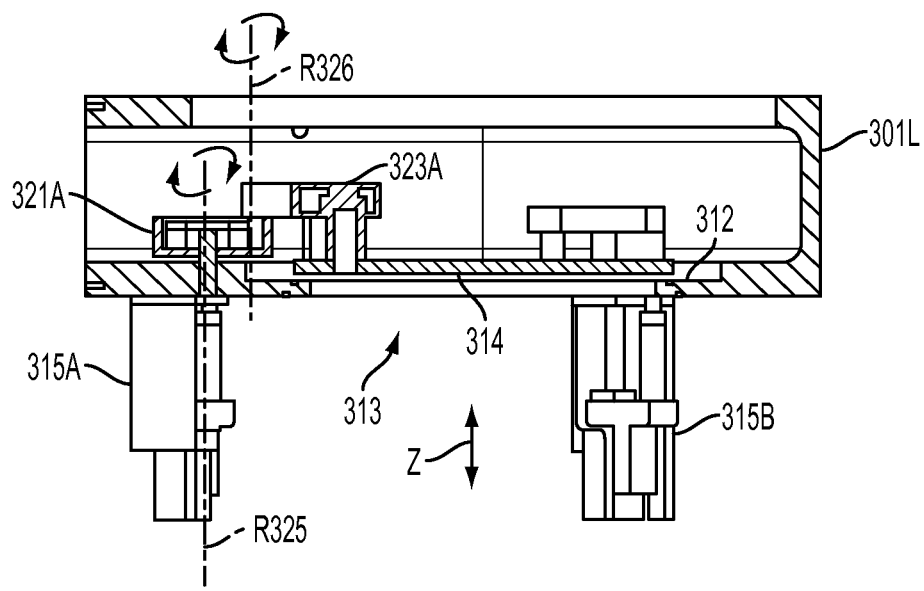

FIGS. 3A-C show a second example embodiment of a process chamber gas flow control apparatus 300. Apparatus 300 may include a process chamber 302 (of which only a lower housing portion 301L is shown). Process chamber 302 may include a side opening 309 configured to receive a slit valve or other suitable sealing member. Process chamber 302 may also include a valve seat 312 and a gas exhaust port 313 (FIG. 3C). Valve seat 312 may be configured to receive an exhaust port valve for completely sealing gas exhaust port 313.

Apparatus 300 may also include an exhaust port valve 314, a plurality of actuators (of which only actuators 315A and 315B are shown in FIG. 3C), and a valve support mechanism 316. Exhaust port valve 314 may be configured to seal exhaust port 313 and configured to move in the X, Y, and Z directions relative to exhaust port 313 to adjust a gas flow pattern within process chamber 302. The plurality of actuators may include a plurality of linear actuators (e.g., actuators 315A and 315B) configured to move exhaust port valve 314 in the Z direction (FIG. 3C) and may include at least one rotational actuator (e.g., actuator 315A or one or more other actuators) configured to move exhaust port valve 314 in the X and Y directions (FIG. 3B). The plurality of actuators may include any suitable number of motors and/or devices configured to provide linear and rotational motion as described herein.

Valve support mechanism 316 may include a plurality of couplings 318A-C and a respective plurality of rotatable-joint arms 319A-C. The plurality of rotatable-joint arms 319A-C may each be coupled to exhaust port valve 314 and to a respective one of the plurality of linear actuators (e.g., actuators 315A and 315B) via a respective coupling 318A-C. Rotatable-joint arm 319A may be coupled to the at least one rotational actuator (which may be, e.g., actuator 315A) via coupling 318A or another suitable coupling. Couplings 318A-C may each be any suitable mechanical member coupled to the plurality of actuators and configured to transfer linear and/or rotational motion from the plurality of actuators to rotatable joint arms 319A-C as described herein.

In some embodiments, three actuators (including, e.g., actuators 315A and 315B) may be linear actuators coupled to respective rotatable-joint arms 319A-C and configured to move exhaust port valve 314 in the Z direction (FIG. 3C). A different number of linear actuators may be used in other embodiments to move exhaust port valve 314 in the Z direction.

In some embodiments, actuator 315A may also be a rotational actuator coupled to rotatable-joint arm 319A and configured to provide a first rotational motion about an axis R325 to first arm section 321A of rotatable-joint arm 319A. The first rotational motion may be in clockwise and/or counterclockwise directions. Alternatively, a separate rotational actuator (not shown) may be coupled to rotatable-joint arm 319A to provide the first rotational motion.

In some embodiments, actuator 315A or a second rotational actuator (not shown) may be coupled to rotatable-joint arm 319A and configured to provide a second independent rotational motion about an axis R326 to second arm section 323A of rotatable-joint arm 319A. The second rotational motion may be in clockwise and/or counterclockwise directions. Rotatable-joint arm 319A may have, in some embodiments, a pulley mechanism in first arm section 321A configured between axis R325 and axis R326 to drive the second independent rotation of second arm section 323A about axis R326. This pulley mechanism may operate and be configured similarly as the pulley mechanism described below in connection with arm 419 of FIG. 4C. Other suitable mechanisms for transferring rotational motion about axis R325 to about axis R326 may be used.

Rotational motion of rotatable-arm 319A about axis R325 and/or axis R326 may drive rotatable-joint arms 319B and 319C about their rotatable joints in a follower or push-pull type of relationship with rotatable-arm 319A as exhaust port valve 314 moves in various X and/or Y directions.

To adjust a gas flow pattern in process chamber 302, exhaust port valve 314 may be moved in the Z direction by a desired amount away from exhaust port 313 to create an equal opening radially between exhaust port valve 314 and valve seat 312. The Z-direction movement of exhaust port valve 314 may be provided by three linear actuators (including, e.g., actuators 315A and 315B) coupled to respective couplings 318A-C. Actuator 315A, and/or one or more separate rotatable actuators, may then cause first arm section 321A of rotatable-joint arm 319A to rotate about axis R325 and/or second arm section 323A of rotatable-joint arm 319A to rotate about axis R326 by a desired amount or amounts. This may cause exhaust port valve 314 to move by a desired amount in the X and/or Y directions, creating an opening of a particular size and radial location between exhaust port valve 314 and valve seat 312. (See FIGS. 5A-5D for examples of valve movements and openings in the X and/or Y directions.) The created opening may result in a desired adjustment of the gas flow pattern in process chamber 302. A controller, such as, e.g., controller 120, may be coupled to and configured to drive the plurality of actuators (including, e.g., actuators 315A and 315B) to move exhaust port valve 314 in desired X, Y, and/or Z directions.

Figure 4A:
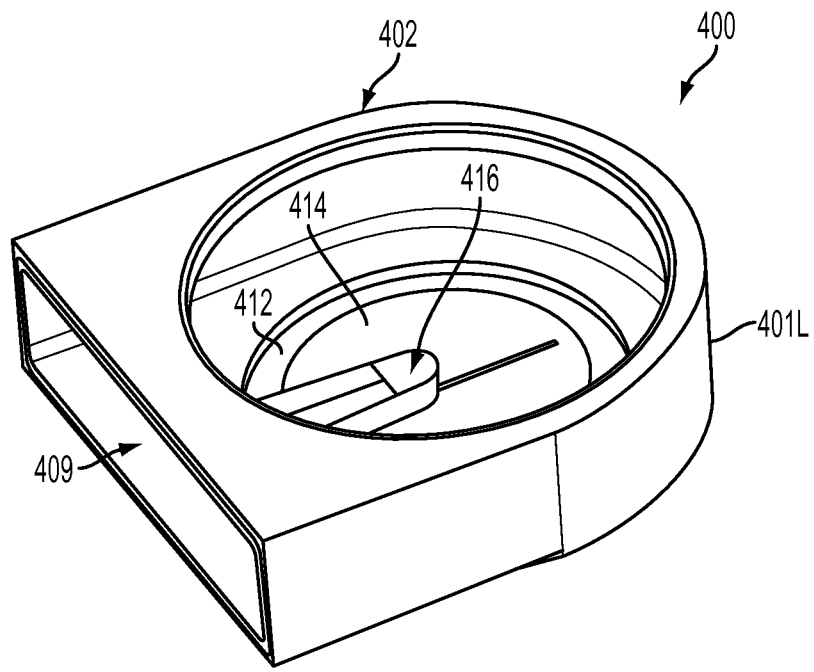
FIGS. 4A-4D illustrate simplified perspective, top, cross-sectional side, and schematic side views of a third process chamber gas flow control apparatus according to embodiments.
Figure 4B:
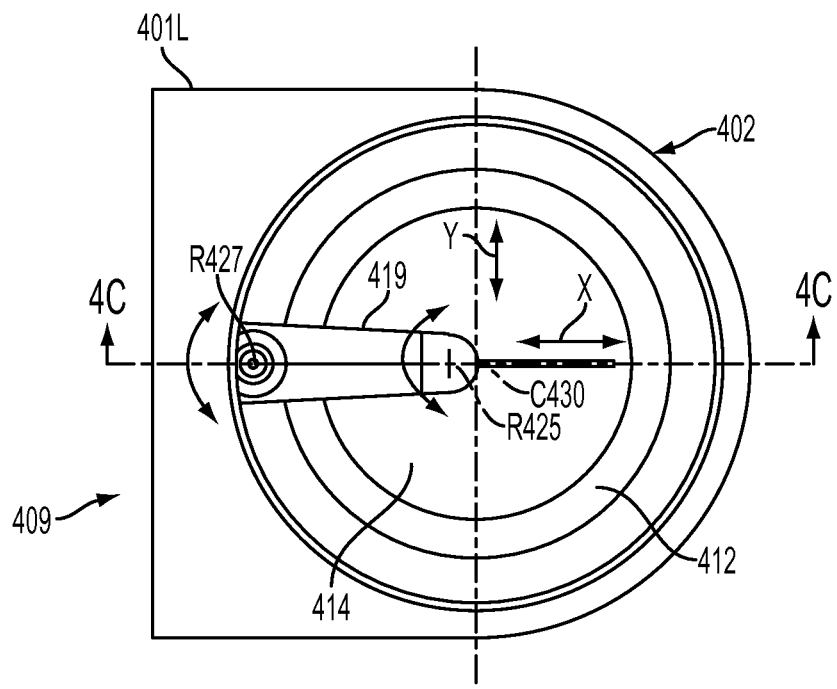
Figure 4C:
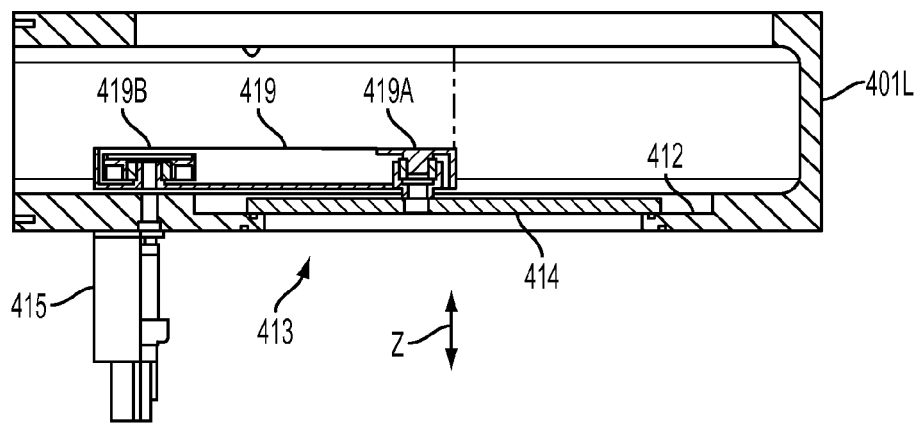

FIGS. 4A-D show a third example embodiment of a process chamber gas flow control apparatus 400. Apparatus 400 may include a process chamber 402 (of which only a lower housing portion 401L is shown). Process chamber 402 may include a side opening 409 configured to receive a slit valve or other suitable sealing member. Process chamber 402 may also include a valve seat 412 and a gas exhaust port 413 (FIG. 4C). Valve seat 412 may be configured to receive an exhaust port valve for completely sealing gas exhaust port 413.

Figure 4D:
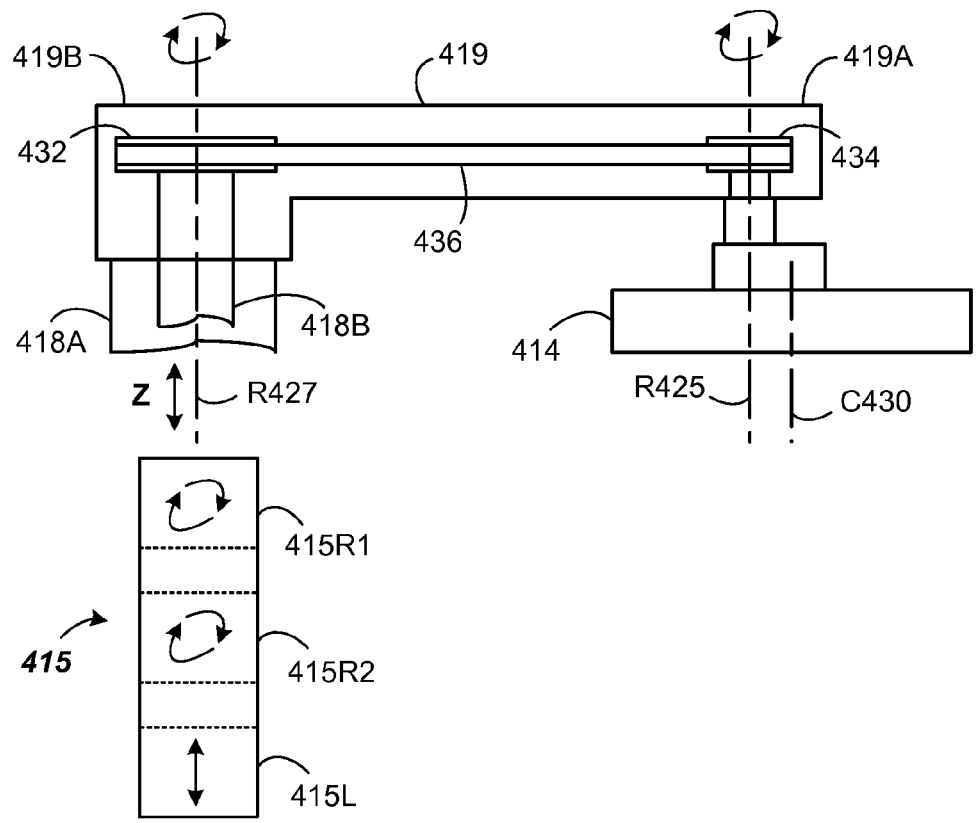

Apparatus 400 may also include an exhaust port valve 414, an actuator 415, and a valve support mechanism 416. Exhaust port valve 414 may be configured to seal exhaust port 413 and configured to move in the X, Y, and Z directions relative to exhaust port 413 to adjust a gas flow pattern within process chamber 402. Actuator 415 may be any suitable number of motors and/or devices configured to provide linear and first and second independent rotational motion. For example, as shown in FIG. 4D, actuator 415 may include or represent a linear actuator 415L and first and second rotational actuators 415R1 and 415R2. Valve support mechanism 416 may include first and second couplings 418A and 418B and an arm 419. First and second couplings 418A and 418B may be any suitable mechanical member coupled to actuator 415 and configured to transfer linear and rotational motion from actuator 415 to arm 419 as described herein.

Arm 419 may have a first end 419A rotatably coupled to exhaust port valve 414 at a location offset from the center C430 of valve 414. Arm 419 may be configured to rotate valve 414 about offset axis R425 (see FIGS. 5A-D for example valve movements). Arm 419 may have a second end 419B rotatably coupled to actuator 415 via couplings 418A and 418B, wherein arm 419 is configured to move in the Z direction via linear actuator 415L and couplings 418A and 418B. Arm 419 may also be configured to rotate about axis R427 in the X and Y directions via rotational actuator 415R1 and coupling 418A.

In some embodiments, arm 419 may include a pulley mechanism as shown in FIG. 4D configured to transfer rotational motion about axis R427 from rotational actuator 415R2 to rotational motion about axis R425. Arm 419 may include a first pulley 432, a second pulley 434, and a belt 436 connected to first and second pulleys 432 and 434. First pulley 432 may be coupled to coupling 418B, which in turn may be coupled to rotational actuator 415R2. As first pulley 432 rotates about axis R427, belt 436 causes second pulley 434 to rotate about axis R425.

The combination of rotating movements of arm 419 about axis R425 and of exhaust port valve 414 about axis R427 allows exhaust port valve 414 to move in various X and Y directions, as shown in FIGS. 5A-D, to create openings of various size and location. A controller, such as, e.g., controller 120, may be coupled to and configured to drive actuator 415 (e.g., actuators 415R1, 415R2, and 415L) to move exhaust port valve 414 in desired X, Y, and/or Z directions.

FIGS. 5A-F illustrate example movements of an exhaust port valve 514 in the X, Y and/or Z directions relative to an exhaust port 513 and a valve seat 512 in a process chamber bottom 501B that any one of process chamber gas flow control apparatuses 200, 300, and/or 400 may be configured to perform. For example, FIG. 5A shows exhaust port valve 514 either in closed position or moved in a Z-direction position (as shown in FIG. 5E) relative to exhaust port 513 and valve seat 512. Exhaust port valve 514 may be configured to move in the X and/or Y directions via a radial path P525 about axis R525, which is offset from the center C530 of valve 514. The radius of radial path P525 may be the distance D between axis R525 and center C530. Radial path P525 may be similar to, e.g., the radial path created by offset axis R425 and center C430 of apparatus 400. After having been moved in the Z direction a sufficient amount to clear valve seat 512 and bottom 501B of a process chamber, exhaust port valve 514 may be moved in the X direction as shown in FIGS. 5B and 5F by rotating about radial path P525 to point 538. This may create an exhaust port opening 513B. Similarly, rotation of exhaust port valve 514 about radial path P525 to a point 540 as shown in FIGS. 5C and 5F may create an exhaust port opening 513C. And, rotation of exhaust port valve 514 about radial path P525 to a point 542 as shown in FIGS. 5D and 5F may create an exhaust port opening 513D. Other openings are possible. The various openings that may be created by rotation of exhaust port valve 514 about radial path P525 may allow a gas flow pattern in a process chamber to be adjusted as desired.

Figure 6:
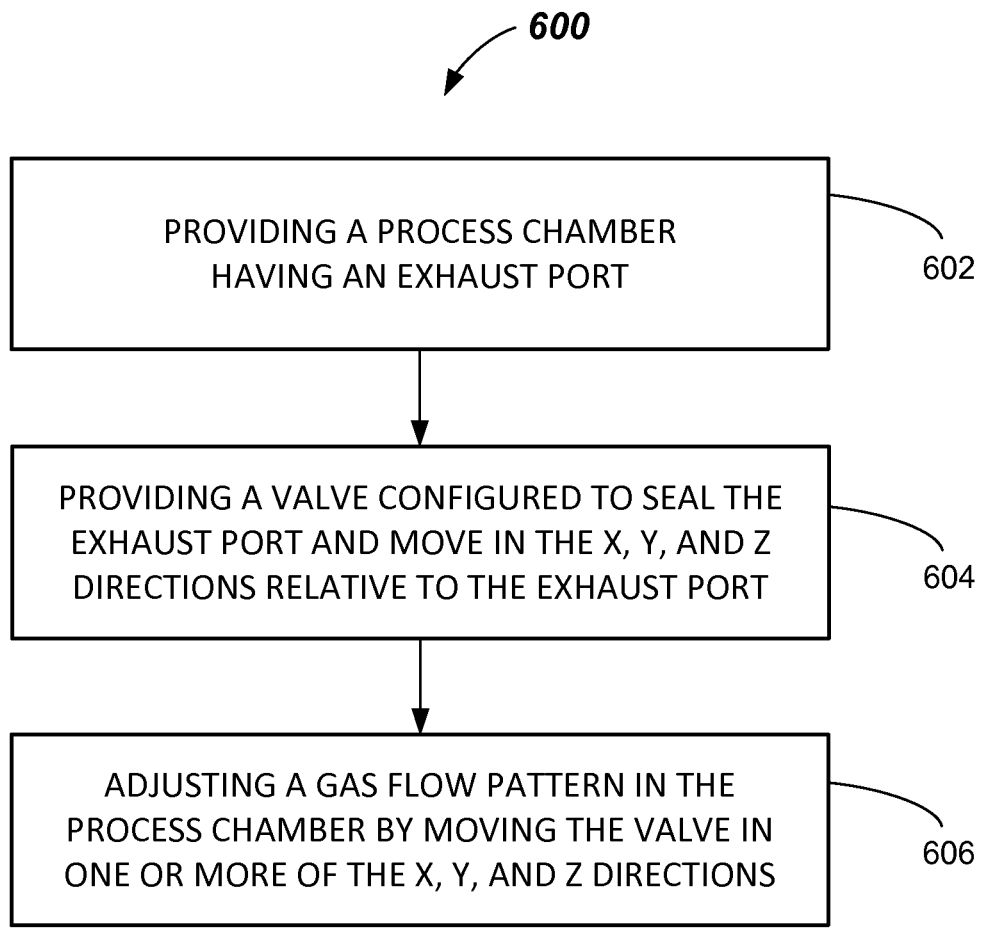
FIG. 6 illustrates a flowchart of a method of adjusting a flow of a process gas within a process chamber according to embodiments.

FIG. 6 illustrates a method 600 of adjusting a flow of a process gas within a process chamber in accordance with one or more embodiments. At process block 602, method 600 may include providing a process chamber having an exhaust port. In some embodiments, the process chamber may be, e.g., any one of process chambers 102-402 having a respective exhaust port 113-413, as shown in FIGS. 1-4C.

At process block 604, a valve configured to seal the exhaust port and configured to move in the X, Y, and Z directions relative to the exhaust port may be provided. For example, in some embodiments, the valve may be any one of valves 114-514 as shown in FIGS. 1-5D.

At process block 606, method 600 may include adjusting a gas flow pattern in the process chamber by moving the valve in one or more of the X, Y, and Z directions. For example, in some embodiments, a gas flow pattern in a process chamber may be adjusted by moving exhaust port valve 514 as shown in FIGS. 5B-D.

The above process blocks of method 600 may be executed or performed in an order or sequence not limited to the order and sequence shown and described. For example, in some embodiments, process blocks 604 may be performed before or simultaneously with process blocks 602.

Persons skilled in the art should readily appreciate that the embodiments of the invention described herein are susceptible of broad utility and application. Many embodiments and adaptations of the invention other than those described herein, as well as many variations, modifications, and equivalent arrangements, will be apparent from, or reasonably suggested by, the invention and the foregoing description thereof, without departing from the substance or scope of the invention. For example, although described herein as being used in a process chamber of an electronic device manufacturing system, process chamber gas flow control apparatus in accordance with one or more embodiments of the invention may be used with any suitable chamber or structure that receives a flow of gas and has an exhaust port. Accordingly, while the invention has been described herein in detail in relation to specific embodiments, it should be understood that this disclosure is only illustrative and presents examples of the invention and is made merely for purposes of providing a full and enabling disclosure of the invention. This disclosure is not intended to limit the invention to the particular apparatus, devices, assemblies, systems, or methods disclosed, but, to the contrary, the intention is to cover all modifications, equivalents, and alternatives falling within the scope of the invention.

What is claimed is:

1. A method of adjusting a flow of a process gas within a process chamber, comprising:
providing a process chamber having a process gas inlet, an exhaust port, and a side opening adapted to allow a substrate to be provided to and withdrawn from the process chamber;
providing a valve configured to seal the exhaust port and configured to move in the X, Y, and Z directions relative to the exhaust port; and
adjusting a gas flow pattern in the process chamber by moving the valve in one or more of the X, Y, and Z directions.

2. The method of claim 1, wherein the adjusting comprises actuating one or more actuators coupled to the valve to move the valve in one or more of the X, Y, and Z directions.

3. The method of claim 1, further comprising providing one or more rotational actuators configured to move the valve in one or more of the X and Y directions.

4. The method of claim 1, further comprising providing one or more linear actuators configured to move the valve in the Z direction.

5. The method of claim 1, further comprising adjusting an offset between a center of the exhaust port and an axis of rotation.

6. A process chamber gas flow control apparatus, comprising:
- a process chamber configured to process a substrate therein, the process chamber having a side opening adapted to allow the substrate to be provided to and withdrawn from the process chamber, a process gas inlet, and an exhaust port; and
- a valve configured to seal the exhaust port and configured to move in the X, Y, and Z directions relative to the exhaust port to adjust a gas flow pattern within the process chamber.

7. The process chamber gas flow control apparatus of claim 6, further comprising a plurality of actuators coupled to the valve and configured to move the valve in the X, Y, and Z directions.

8. The process chamber gas flow control apparatus of claim 7, wherein the plurality of actuators includes at least one rotational actuator configured to move the valve in the X and Y directions.

9. The process chamber gas flow control apparatus of claim 7, wherein the plurality of actuators includes at least one linear actuator configured to move the valve in the Z direction.

10. The process chamber gas flow control apparatus of claim 6, further comprising:
- a plurality of actuators configured to move the valve in the X, Y, and Z directions;
- a support arm assembly coupled to the plurality of actuators; and
- a slide member coupled to one of the plurality of actuators and to the valve and configured to adjust an offset between a center of the exhaust port and an axis of rotation.

11. The process chamber gas flow control apparatus of claim 6, further comprising:
- a plurality of linear actuators configured to move the valve in the Z direction;
- a rotational actuator configured to move the valve in the X and Y directions; and
- a plurality of rotatable-joint arms each coupled to the valve and to a respective one of the plurality of linear actuators, wherein one of the plurality rotatable-joint arms is coupled to the rotational actuator.

12. The process chamber gas flow control apparatus of claim 6, further comprising an actuator and an arm, the arm having a first end rotatably coupled to the valve at a location offset from the center of the valve and a second end rotatably coupled to the actuator, wherein the arm is configured to move in the Z direction via a coupling at the second end.

13. An electronic device manufacturing system, comprising:
- a process chamber configured to process a substrate therein, the process chamber having an exhaust port and a side opening adapted to allow the substrate to be provided to and withdrawn from the process chamber;
- a process gas inlet coupled to the process chamber and configured to direct a process gas into the process chamber; and
- a valve configured to seal the exhaust port and configured to move in the X, Y, and Z directions relative to the exhaust port to adjust a gas flow pattern within the process chamber.

14. The electronic device manufacturing system of claim 13, further comprising at least one actuator coupled to the valve and configured to move the valve in the X, Y, and Z directions.

15. The electronic device manufacturing system of claim 14, further comprising a controller coupled to the at least one actuator and configured to drive the at least one actuator to move the valve in the X, Y, and Z directions.

16. The electronic device manufacturing system of claim 13, wherein the process gas inlet and the exhaust port are on opposite sides of the process chamber.

17. The electronic device manufacturing system of claim 13, further comprising a valve seat disposed about the periphery of the exhaust port.

18. The electronic device manufacturing system of claim 13, further comprising:
- a plurality of actuators configured to move the valve in the X, Y, and Z directions;
- a support arm assembly coupled to the plurality of actuators; and
- a slide member coupled to one of the plurality of actuators and to the valve and configured to adjust an offset between a center of the exhaust port and an axis of rotation.

19. The electronic device manufacturing system of claim 13, further comprising:
- a plurality of linear actuators configured to move the valve in the Z direction;
- a rotational actuator configured to move the valve in the X and Y directions; and
- a plurality of rotatable-joint arms each coupled to the valve and to a respective one of the plurality of linear actuators, wherein one of the plurality rotatable-joint arms is coupled to the rotational actuator.

20. The electronic device manufacturing system of claim 13, further comprising an actuator and an arm, the arm having a first end rotatably coupled to the valve at a location offset from the center of the valve and a second end rotatably coupled to the actuator, wherein the arm is configured to move in the Z direction via a coupling at the second end.

* * * * *